United States Patent [19]
Cripe

[11] Patent Number: 5,392,007
[45] Date of Patent: Feb. 21, 1995

[54] MODULATOR HAVING IMPROVED ENCODING

[75] Inventor: David W. Cripe, Quincy, Ill.

[73] Assignee: Harris Corporation, Melbourne, Fla.

[21] Appl. No.: 226,565

[22] Filed: Apr. 12, 1994

[51] Int. Cl.$^6$ .............................. H03C 1/00; H03F 3/38
[52] U.S. Cl. .................................. 332/149; 332/159; 330/10; 455/108
[58] Field of Search ............... 332/149, 159, 160, 161, 332/162; 330/10; 455/108

[56] References Cited

U.S. PATENT DOCUMENTS

| | | | |
|---|---|---|---|
| 4,205,241 | 5/1980 | Fisher et al. | 332/159 X |
| 4,403,197 | 9/1983 | Swanson | 330/10 |
| 4,804,931 | 2/1989 | Hulick | 332/149 X |
| 5,132,637 | 7/1992 | Swanson | 330/10 |
| 5,260,674 | 11/1993 | Hulick | 332/149 |
| 5,309,114 | 5/1994 | Swanson | 330/10 |

*Primary Examiner*—David Mis
*Attorney, Agent, or Firm*—Tarolli, Sundheim & Covell

[57] ABSTRACT

A pulse step modulator includes a plurality of N series connected unit step modules each including a DC voltage source having a value V. A plurality of M series connected binary step modules are connected together in series with the series connected unit step modules with each binary step module including a DC voltage source having a value which is a fraction of V. Each module has an associated actuatable switch means for, when actuated, turning on the associated module to provide a step voltage. An output circuit connected to the series connected modules for providing an output voltage to a load wherein the magnitude of the output voltage is equal to the sum of all of the voltage sources of the modules that are turned on. An analog input signal is converted into digital words, each word including first and second multi-bit digital portions. The first portion is converted into N unit step control signals for controlling actuation of the N unit step modules so that the number of the unit step modules that are turned on is dependent upon the magnitude of the analog input signal. The second multi-bit digital portion includes an M bit binary pattern that varies with increasing and decreasing values of the input analog signal. An encoder responds to the binary bit pattern reaching a preselected binary bit pattern and changes the value thereof by a given amount.

18 Claims, 3 Drawing Sheets

MODULATOR HAVING IMPROVED ENCODING

FIELD OF THE INVENTION

This invention relates to the art of modulators and, more particularly, to modulators which are particularly applicable for use in AM radio broadcasting systems.

BACKGROUND OF THE INVENTION

In AM radio broadcasting in the medium-wave and short-wave bands, a high-power vacuum tube is conventionally used in the final radio frequency amplifier stage of the transmitter. For maximum power-amplification efficiency, this tube is not operated as a linear amplifier, but rather as a class C or class D biased circuit, producing an RF envelope which follows that of the B+DC supply voltage provided to the tube anode. Thus, modulation of the RF signal is achieved through varying the B+DC supply to the plate anode of the tube. The high-powered audio amplification circuitry required to vary this voltage is referred to in the art as the modulator.

Recently, a modulator to achieve the foregoing has been employed in the art and is known as a pulse step modulator (PSM). Such a pulse step modulator is disclosed in U.S. Pat. No. 4,403,197 to H. I. Swanson. Briefly, a pulse step modulator (PSM) as disclosed in that patent includes a plurality of series connected unit step modules each of which includes an isolated DC voltage source, a remotely controlled switch and a series diode. The switch in each module may be remotely controlled to turn the module on or off. As each module is turned on, it provides a step voltage. As the various modules are turned on in a stepwise fashion, the output voltage will increase in steps from 0 volts to a maximum voltage with the maximum equalling the sum of all of the module DC voltage sources. A lowpass filter at the output may be employed for removing switching noise. An encoder or the like monitors a time varying input signal, such as an audio signal, and turns on one of the unit step modules for each incremental increase in the value of the audio signal. As the audio signal continues to increase in value, the modules are turned on one at a time in a given order. Similarly, as the audio signal decreases in value, the modules are sequentially turned off in the reverse order.

The pulse step modulator described above also includes circuitry to obtain fine resolution of the output voltage by including a plurality of fractional voltage step modules in the modulator series circuit. This permits generation of output voltages that would otherwise be difficult to obtain. Consequently, the modulator circuit includes a plurality of series connected unit step modules as described above which are connected in series with a plurality of series connected binary step modules which are connected in series with each other. Each binary step module also includes an isolated DC voltage source, a remotely controlled switch and a series diode. However, the DC voltage sources are of different values from each other and from that employed in the unit step modules. Thus, each voltage source in the unit step modules has a value V. The binary modules have voltage sources that vary in value from the most significant binary module to the least significant binary module. Thus, the most significant binary module has a voltage source that is equal to one-half that of the voltage source in each unit step module or V/2. Each successive binary module has a voltage source that is of a value equal to one-half that of the previous module. Consequently, activation of the binary modules in a binary-counting sequence will create a linear increase in the output voltage.

The switches utilized by the unit step modules must be capable of handling both high voltage and current and are typically devices of the IGBT or GTO transistor families. The binary step modules, in contrast, operate at lower DC voltages so that they may utilize MOSFET transistors as switches. The switching efficiency of MOSFET transistors is considerably higher than that of either IGBT or GTO transistors and it becomes essential to the efficiency of a modulator to limit the rate of switching of the unit step modules. A high rate of switching of the switches used in the binary step modules or the unit step modules is hereinafter referred to as module dither. It is permissible to allow the binary step modules which utilize MOSFET switching devices to dither. There will exist conditions of output voltage at which one of the unit step modules may tend to dither. Due to the less efficient switching performance of the IGBT or GTO transistor switches employed in the unit step modules, if the system is allowed to operate continuously with unit step dithering, the transistor switch employed in the unit step module being dithered will likely overheat and fail.

SUMMARY OF THE INVENTION

It is an object of the present invention to provide an improved means of digitally encoding the module activation signals for use in a pulse step modulation (PSM) circuit.

It is a still further object of the present invention to provide such an encoding means for confining switching dither to only those modules within the modulator that have been optimized for their switching performance, such as the binary modules discussed above.

The present invention contemplates the provision of a modulator, such as a pulse step modulator, that employs a plurality of N series connected unit step modules each including a first signal source, such as a DC voltage source having a value V, and an associated actuatable switch for, when actuated, turning on the associated module to provide a unit signal, such as a unit step voltage of the value V. It is further contemplated that a plurality of M series connected binary step modules be provided which are connected in series with the unit step modules with each binary step module including a fractional signal, such as a DC voltage source having a value which is a fraction of V, and wherein each binary step module has an associated actuatable switch for, when actuated, turning on the associated binary step module to provide a binary step signal. An output circuit is connected to the series connected modules for providing an output signal to a load wherein the magnitude of the output signal is equal to the sum of all of the signal sources of the unit step modules and the binary step modules that are turned on. An analog input signal is converted at a conversion clock rate into digital words with each digital word including first and second multi-bit digital portions. The first portion is converted into N unit step control signals for controlling actuation of the N unit step modules so that the number of unit step modules that are turned on is dependent upon the magnitude of the analog input signal. The second multi-bit digital portion includes a binary bit pattern that varies with the values of the input analog signal.

In accordance with one aspect of the present invention, an encoder responds to the binary bit pattern of the second portion while it is varying in value and, more specifically, to a preselected binary bit pattern. In response thereto, the bit pattern of the second portion is changed by a given amount.

In accordance with a more limited aspect of the present invention, the encoder responds to a transition in the binary bit pattern of the second portion from a condition in which all of the bits are of a first binary level to a condition wherein all of the bits are of a second binary level and then varying the bit pattern by a given amount.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENT

Figure 1:
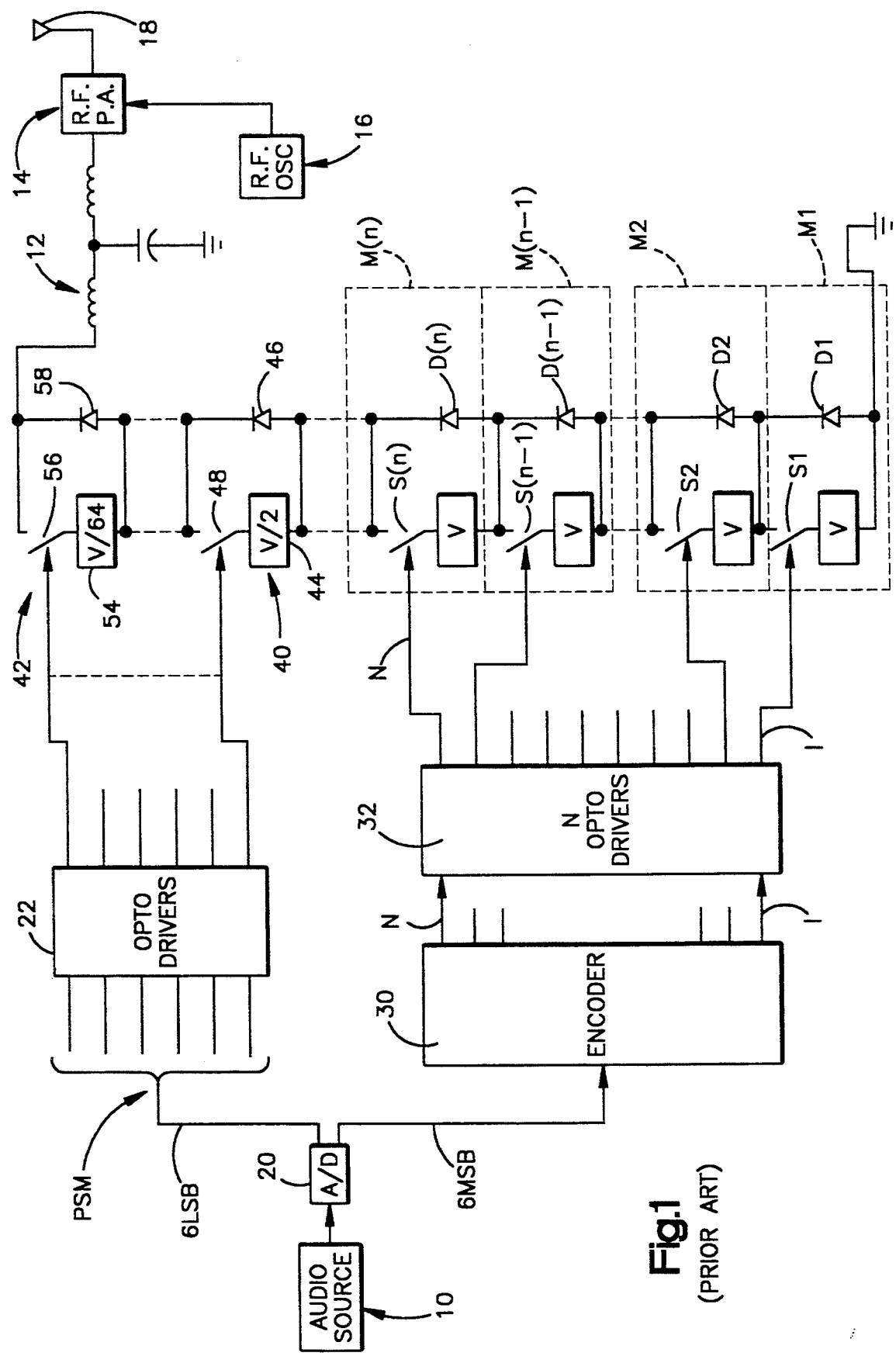
FIG. 1 is a schematic-block diagram illustration of a prior art AM broadcasting transmitter employing a pulse step modulator (PSM)

Reference is now made to the drawings wherein the showings are for purposes of illustrating a preferred embodiment of the invention only and not for purposes of limiting the same. FIG. 1 illustrates an AM transmitter which incorporates a pulse step modulator (PSM). The transmitter includes an audio source which generates an amplitude and frequency varying audio signal which is to be amplified and transmitted. This signal is supplied to the pulse step modulator PSM, to be described in greater detail hereinafter, and which amplifies the signal to a high power level and provides a resulting amplitude signal $V_{out}$ to a lowpass filter 12. The resulting amplified and filtered signal is then supplied to the audio input of a conventional RF power amplifier 14 where it amplitude modulates an RF carrier signal supplied by an RF oscillator 16. The resulting AM signal is then transmitted by a conventional antenna 18.

The pulse step modulator (PSM) includes a conventional analog-to-digital converter 20 which receives the analog audio signal from the audio source 10 and converts it into a multi-bit digital representation thereof. The analog input signal is converted into a 12 bit digital signal. The six least significant bits (6 LSB) are supplied to an optical driver 22. The optical driver has six output circuits which serve to turn on or off six switches which are respectively associated with six differently weighted voltage sources. These are weighted such that each is one-half that of the previous source; that is, $\frac{1}{2}V$, $\frac{1}{4}V$, $\frac{1}{8}V$, etc These will be hereinafter referred to as the fractional step voltage modules as opposed to the unit step voltage modules to be discussed in greater detail hereinbelow.

The six most significant bits (6 MSB) are supplied to an encoder 30 having N output circuits which are supplied to an optical driver circuit 32. Circuit 32 has N output circuits respectively connected to N unit step switches S1 through SN. Switches S1 through SN are respectively located in unit step modules M1 through M(N).

The encoder 30 sequentially energizes its output circuits 1 through N with incremental increases in the magnitude of the analog signal and de-energizes the output circuits in the reverse order with incremental decreases in the magnitude of the analog signal. These are reflected through the optical driver circuit 32. The optical driver circuit has output circuits 1 through N which serve to sequentially close switches S1 through SN as the analog input signal incrementally increases in magnitude and to sequentially open the switches, in the reverse order, as the input analog signal incrementally decreases in magnitude. Whenever a switch S1 through SN is open, the associated unit step module is turned off and whenever a switch is closed, the associated unit step module is turned on.

Each unit step module M1 through M(N) includes an incremental unit step voltage source V, a switch such as switch S1 and a diode such as diode D1 all interconnected as shown with respect to module M1 in FIG. 1. The unit step modules are connected together in series with diodes D1 through D(N). Each incremental voltage source may be considered as a DC voltage source of a fixed magnitude which, in practice, may be on the order of 600 volts. The total voltage across the series connected modules is dependent upon the number of modules which have been turned on by closure of the associated switches S1 through S(N). For example, if all of the switches S1 through SN are closed, then all of the unit step voltage sources V are connected together in series and added together to provide an output voltage NV. If each unit step voltage source V has a value on the order of 600 volts and N is on the order of 50, then the total voltage may be on the order of 30,000 volts.

In the discussion presented above, reference is made to the unit step voltage sources V located in modules M1 through M(N). For finer resolution in providing an output signal, there is provided six fractional step voltage sources connected to six output circuits of the optical driver circuit 22. Each is a fractional voltage source with all six adding up to approximately the value of a single unit step voltage source V (such as 600 volts). Two of the fractional step voltage source modules 40 and 42 are illustrated in FIG. 1 with each module including a weighted fractional voltage source, a switch and a bypass diode. Thus, module 40 includes a fractional voltage source 44 which has a weight equal to one-half that of a unit step voltage V. Module 40 also includes a bypass diode 46 and a switch 48. Module 42 includes a binary weighted voltage source 54 which has a value equal to 1/64th of a unit step voltage source V. This voltage source 54 has associated therewith a switch 56 and a diode 58 interconnected as in the case of the other modules discussed hereinbefore. These fractional voltage source modules respectively represent fractional voltages $\frac{1}{2}V$, $\frac{1}{4}V$, $\frac{1}{8}V$, 1/16 V, 1/32V and 1/64 V. These will be turned on and off in a somewhat random fashion as the input voltage varies in magnitude between two voltage levels represented by two of the unit step sources. That is, if the input voltage has exceeded a level sufficient to turn on twenty of the unit step voltage sources but has not yet exceeded the level to turn on the next or twenty-first unit step voltage source, then during the interim period the fractional or binary voltage modules will turn on and off as the analog input voltage varies in magnitude between these two voltage levels.

The output voltage that will be supplied to the filtering circuit 12 will be the sum of all of the unit step voltage sources that have been turned on plus the sum of the fractional voltage sources that have been turned on. The contribution by the fractional sources will be somewhat random as noted above.

The value of each voltage source V in each of the unit step modules discussed above may be on the order of 600 volts. The switches associated with the unit step modules must be capable of handling such a high voltage and the ensuing current. Consequently, these switches, in practice, take the form of IGBT or GTO transistor switches. The fractional or binary step modules, such as modules 44 and 54 described in FIG. 1, operate with lower DC voltages so these may employ MOSFET transistors as switches. The switching efficiency of MOSFET transistors is considerably higher than that of either IGBT transistors or GTO transistors and, hence, it becomes essential to the efficiency of the modulator to limit the rate of switching of the unit step modules. This is achieved in accordance with the present invention by providing a hysteretic switching sequence wherein the encoding sequence for activating the modules within the modulator are controlled by previously encoded states. The circuitry to be discussed in greater detail hereinafter serves to confine switching dither to certain modules within the modulator circuit. The certain modules are optimized for their switching performance in that each employs a MOSFET transistor. More specifically, the switching dither is confined to the binary modules, as will be described in greater detail hereinafter.

Figure 2:
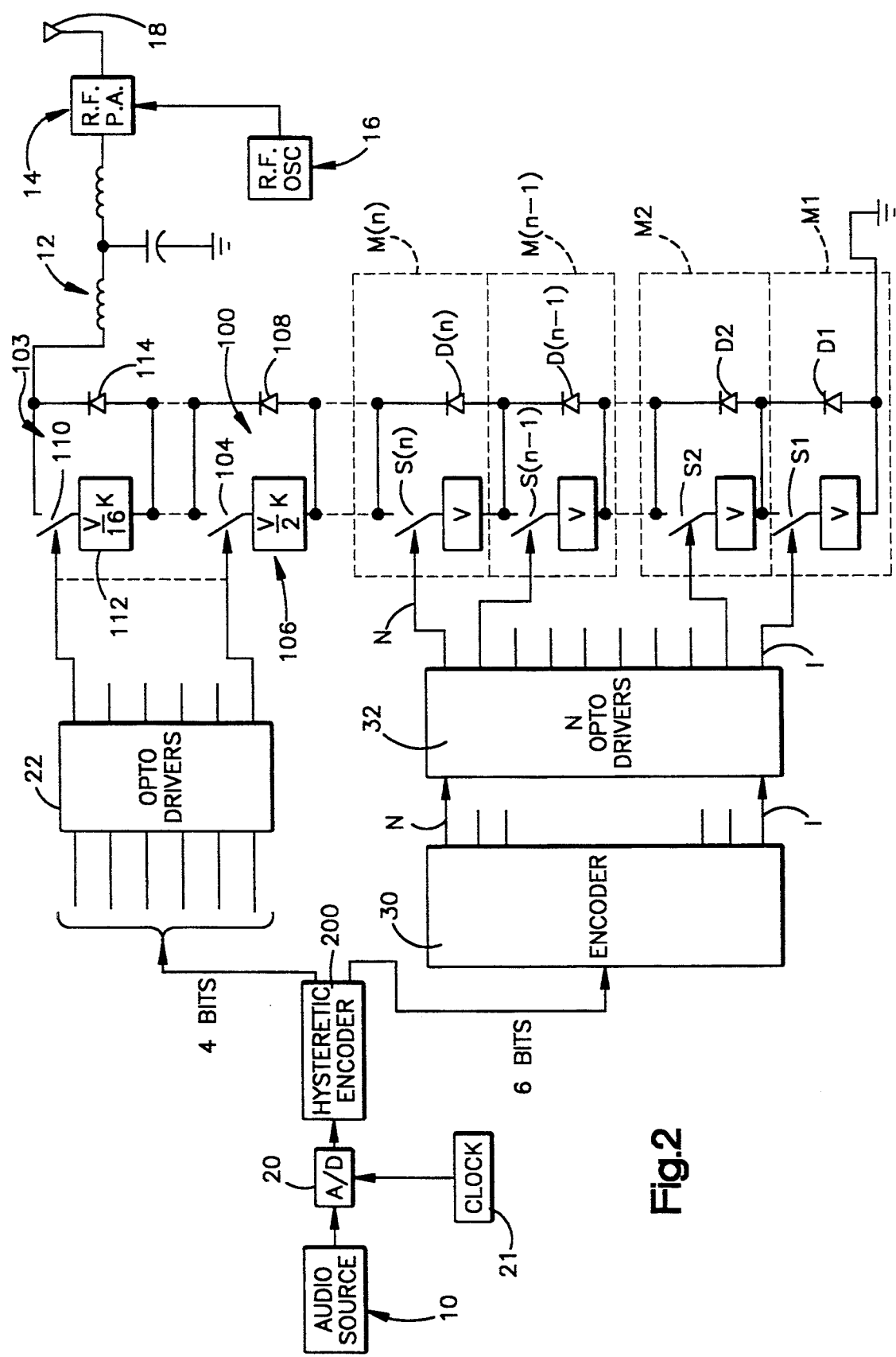
FIG. 2 is a schematic-block diagram illustration of a pulse step modulator (PSM) employing improved encoding circuitry in accordance with the present invention.

Reference is now made to FIG. 2 which discloses a pulse step modulator similar to that as described hereinabove with reference to FIG. 1. In view of the similarities between the two pulse step modulators in FIGS. 1 and 2, like components in both Figures are identified with like character references and only those components which differ will be described in greater detail hereinbelow.

In this embodiment of the invention, there is no change in the unit step modules M1 through M(n). There is some change in the binary modules to be described. In this embodiment there is disclosed two binary modules 100 and 103. Module 100 includes a switch 104, a voltage source 106 and a diode 108 all interconnected as described hereinabove with reference to FIG. 1. Similarly, module 103 includes a switch 110, a voltage source 112 and a diode 114 all interconnected as discussed hereinbefore with reference to FIG. 1. These binary modules are connected together in series with each other and in series with the unit step modules M1 through M(n). Whereas only two binary modules 100 and 103 are specifically illustrated, they represent four binary modules 100, 101, 102 and 103 with module 100 being considered the most significant module and module 103 being considered the least significant module. This represents a four bit binary number with the most significant bit corresponding with module 100 and the least significant bit corresponding with module 103. It is to be appreciated that whereas this example is being given with respect to a four bit binary number used with four binary modules, this is being done for simplicity in this description only. In practice, there may be several other combinations of binary modules, such as six binary modules.

Interposed between the analog-to-digital converter 20 and the optical driver circuit 22 and the encoder 30, this embodiment provides an encoder which hereinafter is referred to as a hysteretic encoder 200. Encoder 200 will be described in greater detail hereinbelow with reference to FIG. 3 and Tables 1 and 2. The analog-to-digital converter 20 converts the input signal obtained from the audio source into digital signals at a rate dependent upon that of the frequency of a clock 21.

The modulator must be capable of reproducing signals through the audio frequency range, typically through 10 KHz. In order to reproduce these signals with a low degree of distortion, the system analog-to-digital conversion rate must be several times higher than this, typically on the order of 50 KHz. In normal operation, the unit step modules will switch at a rate no higher than that of the audio signal they are reproducing, i.e., 10 KHz. However, during conditions of no audio modulation, the modulator must produce a DC output corresponding to the transmitter's carrier level. There will exist conditions at which the carrier level voltage desired of the modulator will be such that it will fall between the discrete steps which the modulator is capable of generating. Consequently, the modulator must dither between these two adjacent states so as to produce this intermediate voltage level. This dithering will occur at the analog-to-digital clock rate, which is at a rate higher than that at which the module would normally encounter. The binary-step modules, utilizing MOSFETs as their switching devices can accommodate this 50 KHz switching rate. Should a unit step module be involved in dithering, however, the lower switching efficiency of the IGBT or GTO switches used in the unit step module may, at the 50 KHz dither rate, result in the device's overheating and possible failure.

It is desirable to operate the unit step modules at a switching rate no higher than that of the audio signal they are to reproduce. It is also desirable to retain module dither so as to attain higher voltage resolution between module voltage steps. This is achieved through a hysteretic encoding scheme which prevents the dither of unit step modules. The foregoing is accomplished in accordance with the embodiment of the present invention herein with the hysteretic encoder 200.

The hysteretic encoder 200 compares the binary bit pattern of the output from the analog-to-digital converter with predetermined bit patterns and adds or subtracts a binary number dependent upon the comparison. The significance of this will become more apparent from the description that follows hereinafter. In the example being given, the bit pattern being examined is the four least significant bits taken from the analog-to-digital converter 20. It is assumed that this converter provides a ten bit output with the six most significant bits being supplied by way of encoder 200 to encoder 30 for selection of the various unit step modules in a manner as discussed hereinbefore. Within the encoder 30 the ten bit output of the analog-to-digital converter is supplied to a ten bit adder 202 which supplies the six most significant bits to the encoder 30 for activating one or more of the unit step modules in the manner as described hereinabove. The four least significant bits are supplied by the adder 202 to a pair of comparators 204 and 206 as well as to the optical drivers 22.

An operation may be started with no unit step modules activated and with the input signal continuously increasing in magnitude. At some point, the input signal will attain a magnitude sufficient such that the bit pattern of the four least significant bits will be 1111. This is representative of a decimal number 15. Assume that this represents a voltage of 1.5 V. At this point, all of the four binary units 100, 101, 102 and 103 are activated. If the magnitude of the input signal continues to increase, the next bit pattern of the four least significant bits will be 0000. This represents that one unit step module should be turned on and that no binary step modules should be turned on. As the comparator 204 notes that the four least significant bits have a bit pattern of 0000, a match is obtained between the reference pattern in the reference storage unit 205 and the bit pattern provided by the four least significant bits taken from adder 202. The comparator 204 applies a trigger pulse or binary 1 signal to the add input +P of a 10 bit accumulator 210. The accumulator supplies a binary signal pattern representative of the decimal number 6 to be added at the ten bit adder 202. This changes the least significant bit pattern from 0000 to 0110. At this point in time, the encoder 200 has turned on one unit step module and two binary step modules associated with the bit pattern 0110. Thus, binary modules 100 and 103 are turned off and binary modules 101 and 102 are turned on so that the status of the binary modules corresponds with the bit pattern 0110. As the input voltage continues to increase, the binary modules will be turned on and off in accordance with the binary bit pattern of the four least significant bits until the pattern again reaches a magnitude representative of 1.6 V.

The reverse operation takes place as the input voltage continuously decreases in magnitude. Assume that one unit step module is turned on and the bit pattern of the four least significant bits is 0001. This is representative of an output voltage of 1.1 V. On the next binary number iteration by the analog-to-digital converter 20, the four least significant bits will change from a bit pattern of 0001 to 0000. This means that one unit step module is active and no binary step modules are active, for a total voltage of 1.0 V. The next binary number iteration by the analog-to-digital converter should reduce the output voltage to 0.9 V. This represents no unit step modules are activated and that the value of the binary step modules that are activated is 9 or a binary pattern of 1001. This, however, would not normally be the case because in counting down from a number sequence of 0000, the next lower number for the binary number will be 1111 (a count of 15) which represents 1.5V. Consequently, to prevent this from happening, comparator 206 notes that there is a match between the reference binary number in register 207 which is set at 1111 with the bit pattern on the four least significant bits obtained from the adder 202. The four least significant bits have a bit pattern of 1111. Since a match is obtained, the comparator 206 applies a pulse to the subtract input −p of the accumulator 210. The accumulator will now supply a negative 6 (−6) to the adder 202 which then changes the bit pattern of the four least significant bits to 9 (a binary bit pattern of 1001).

Figure 3:
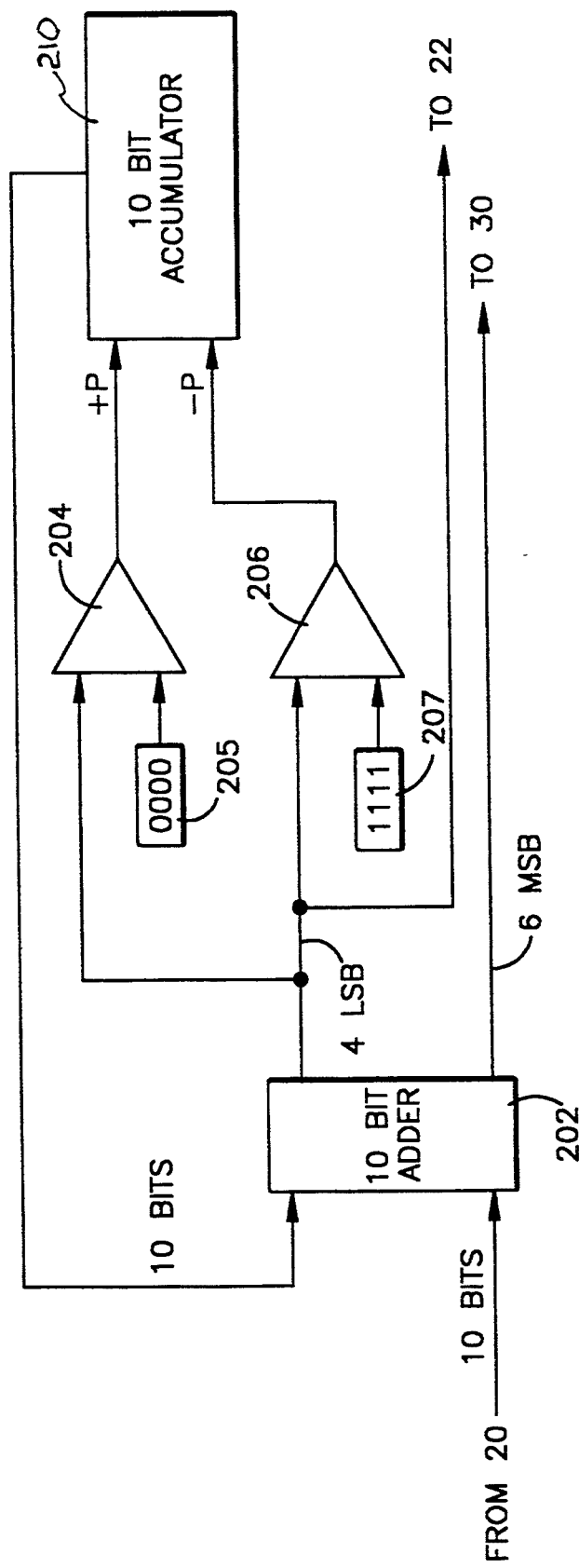
FIG. 3 is a schematic-block diagram illustration of an encoder circuit employed in FIG. 2.

In the embodiment of the invention as illustrated in FIGS. 2 and 3, each of the unit step modules M1 through M(n) employs a DC voltage of an identical magnitude V. The DC voltage of each of the binary step modules 100–103 is substantially less. Thus, the DC voltage of the most significant of the binary step modules equals:

$$\frac{V}{2} K \quad (1)$$

wherein K is greater than 1 and is represented by the following formula:

$$K = \frac{2^M}{2^M - P} \quad (2)$$

wherein P equals an integer less than $2^{M-1}$, and wherein M is equal to the number of binary step modules, which in the example being described is four. The voltage of each successive less significant binary step module is one-half that of the preceding module. Thus, the value of the DC voltage of the next most significant binary step module 101 (not shown) is $V/4K$. Reference is now made to Table I below:

TABLE I

| Unit Step | Binary Step | Output Voltage |
|---|---|---|
| 0 | 0100 | 0.4 V |
| 0 | 0101 | 0.5 V |
| 0 | 0110 | 0.6 V |
| 0 | 0111 | 0.7 V |
| 0 | 1000 | 0.8 V |
| 0 | 1001 | 0.9 V |
| 0 | 1010 | 1.0 V |
| 0 | 1011 | 1.1 V |
| 0 | 1100 | 1.2 V |
| 0 | 1101 | 1.3 V |
| 0 | 1110 | 1.4 V |
| 0 | 1111 | 1.5 V |
| 1 | 0000 | 1.0 V |
| 1 | 0001 | 1.1 V |
| 1 | 0010 | 1.2 V |

Table I illustrates the output voltage for consecutive module activation sequences within a pulse step modulator with values of N=1 (wherein N is equal to the number of unit step modules), M=4 and P=6. The sum voltage of the binary step modules equals:

$$\frac{(2^M - 1)}{(2^M - P)} V \quad (3)$$

From the above, it is seen that there exists some values of two distinct combinations of module activation sequences. The hysteretic encoder 200 causes one of these modulation activation sequences to be selected for a condition of dynamically increasing modular output voltage and the other activation sequence is selected for a condition of dynamically decreasing modulator output voltage. These are respectively illustrated in Table II which is reproduced below.

TABLE II

| UP COUNT | | DOWN COUNT | | |
|---|---|---|---|---|
| Unit Step | Binary Step | Unit Step | Binary Step | Output Volts |
| 0 | 0101 | 0 | 0101 | 0.5 V |
| 0 | 0110 | 0 | 0110 | 0.6 V |
| 0 | 0111 | 0 | 0111 | 0.7 V |
| 0 | 1000 | 0 | 1000 | 0.8 V |
| 0 | 1001 | 0 | 1001 | 0.9 V |
| 0 | 1010 | 1 | 0000 | 1.0 V |
| 0 | 1011 | 1 | 0001 | 1.1 V |
| 0 | 1100 | 1 | 0010 | 1.2 V |
| 0 | 1101 | 1 | 0011 | 1.3 V |
| 0 | 1110 | 1 | 0100 | 1.4 V |
| 0 | 1111 | 1 | 0101 | 1.5 V |
| 1 | 0110 | 1 | 0110 | 1.6 V |
| 1 | 0111 | 1 | 0111 | 1.7 V |
| 1 | 1000 | 1 | 1000 | 1.8 V |

Table II shows under the label "Up Count" a binary unit activation sequence for a condition of a dynamically decreasing modulator output voltage from 0.5 V to 1.8 V. Also, a down count sequence is illustrated under the label "Down Count" for the activation sequence of the binary modules for a condition of dynamically decreasing modulator output voltage. The encoder circuitry to accomplish this is illustrated in FIG. 3 and serves to select the module drive sequence based on the previous state of the module drive and, hence, the term "hysteretic" is applied to this encoder.

This hysteretic module drive encoding results in dither occurring within an amplitude of:

$$VP \quad (4)$$

This dither takes place without causing switching to occur within any unit step module.

Reference is now made to the Table of FIG. 1 which illustrates the operation that would take place without the use of the encoder 200. Table II shows the operation that takes place with the use of the encoder 200 in FIG. 2. With respect to Table I, it is seen that as the output voltage increases in magnitude from 1.4 V to 1.5 V, the binary bit pattern of the four least significant bits changes from 1110 to 1111. Thus, all of the binary modules 100, 101, 102 and 103 are turned on and no unit step module is turned on. At the next iteration of the analog-to-digital converter 20, the four least significant bits will have a bit pattern of 0000, indicating that one unit step module should be turned on and no binary step modules should be turned on. This would cause a discontinuity (from 1.5 V to 1.0 V) in an otherwise continuously increasing output voltage. If the input voltage decreases in magnitude, the bit pattern of the four least significant bits will revert to 1111 causing the unit step module to turn off again and activate four of the binary step modules. If this condition continues to dither back and forth, at the 50 KHz rate, between all of the binary step units being turned on and one of the unit step modules being turned on, the transistor switch in the unit step module will overheat and become damaged. A similar operation takes place for decreasing voltages.

The hysteretic encoder 200 changes the binary count by adding six as the output voltage increases from 1.5 V to 1.6 V and decreases by six as the output voltage decreases from 1.0 V to 0.9 V. This is done by changing the bit pattern of the least significant four bits from. This is illustrated in greater detail in Table II.

Reference is now made to Table II and specifically to the first two columns under the title "Up Count" as well as the last column under the title "Output Volts". Table II shows the operation with the encoder 200 in place while the input voltage is constantly increasing in magnitude. As the output voltage increases from 0.5 V through 1.4 V, it is seen that no unit step modules are turned on but various of the binary step modules are turned on in accordance with the binary pattern shown under the title "Binary Step". Thus, at an output voltage level of 0.5 V, no unit step modules are turned on but the binary step modules are turned on in accordance with the binary bit pattern 0101. This means that binary step modules 101 (not shown) and 103 are turned on to provide an output voltage of 0.5 V. With each iteration of the analog-to-digital converter 20, for an increasing input voltage, the bit pattern of the four least significant bits will change as is shown in the second column in Table II. When the bit pattern becomes 1111, this is indicative of an output voltage of 1.5 V and all four binary step modules 100, 101, 102 and 103 are activated or turned on. In accordance with the invention, at the next iteration when the binary step pattern changes from 1111 to 0000, this is detected by the comparator 204, which adds six to the binary count so that the binary bit pattern becomes 0110. At this point, one unit step module is activated and two binary step modules are activated. The two binary step modules that are activated are modules 101 and 102 so that the output voltage will be 1.6V. Any change in the input voltage by an increment in an upward direction or a downward direction will cause only a change in the binary bit pattern so that switching will take place only within the binary.

Reference is now made to the last three columns in Table II under the title "Down Count". As the output voltage decreases from 1.8 V to 0.5 V in incremental steps, the bit pattern of the four least significant bits changes progressively from 1000, 0111, etc. When the output voltage is at a level of 1.1 V, the bit pattern is 0001 and one unit step module is activated. This is representative of an output voltage of 1.1 V. On the next downward iteration of the analog-to-digital converter, the four least significant bits will attain a level of 0000. This indicates that one unit step module is on and no binary step modules are on for an output voltage of 1.0 V. Normally, the next iteration of the analog-to-digital converter for a continuingly decreasing voltage would result in a binary bit pattern of 1111. However, at this point the comparator 206 recognizes that the bit pattern is 1111 and this matches the bit pattern in the storage register 207 causing the comparator 206 to actuate the accumulator 210 to supply a −6 count to the adder 202. This results in the binary bit pattern becoming 1001 with no unit steps activated. This is representative of an output voltage of 0.9 V.

Whereas the invention has been described in conjunction with a particular embodiment, it is to be appreciated that various modifications will occur to those skilled in the art within the spirit and scope of the invention as defined by the appended claims.

Having described the invention, the following is claimed:

1. A modulator comprising:
   a plurality of N series connected unit modules each including a first signal source and an associated actuatable switching means for, when actuated, turning on said associated module to provide a unit signal;
   a plurality of M series connected binary step modules connected together in series with said series connected unit step modules with each binary step module including a fractional signal source having a value which is a fraction of said first signal source and wherein each said binary step module has an associated actuatable switching means for, when actuated, turning on said associated binary step module to provide a binary step signal;
   an output circuit connected to said series connected modules for providing an output signal to a load wherein the magnitude of the output signal is equal to the sum of all of the signal sources of said modules that are turned on;
   means for receiving an analog input signal and converting same into digital words, each said word including first and second multi-bit digital portions;

means for converting said first portion into N unit step control signals for controlling actuation of said N unit step modules so that the number of said unit step modules that are turned on is dependent upon the magnitude of said analog input signal;

said second multi-bit digital portion including a binary bit pattern that varies with increasing and decreasing values of said input analog signal; and encoding means having means responsive, while said binary bit pattern is varying in value, to a preselected binary bit pattern for changing the value thereof by a given amount.

2. A modulator as set forth in claim 1 wherein said encoding means includes a first means responsive, while said binary bit pattern is increasing in value, to a first preselected binary bit pattern for increasing the value thereof by said given amount.

3. A modulator as set forth in claim 1 wherein said encoding means has means responsive, while said binary bit pattern is decreasing in value, to a second preselected binary bit pattern for decreasing the value thereof by a given amount.

4. A modulator as set forth in claim 1 wherein said encoding means has first means responsive, while said bit pattern is increasing in value, to a first preselected binary bit pattern for increasing the value thereof by a given amount and second means responsive, while said bit pattern is decreasing in value, to a second preselected binary bit pattern for decreasing the value thereof by a given amount.

5. A modulator as set forth in claim 4 wherein said first preselected binary bit pattern is a bit pattern wherein each of the bits exhibits a first binary level and wherein said second preselected bit pattern is a bit pattern wherein each of the bits is of a second binary level.

6. A modulator as set forth in claim 4 wherein said encoding means includes first means for comparing said binary bit pattern with a reference bit pattern representative of said first preselected binary bit pattern and, upon detection of a match, providing a first signal for use in effecting said increase in the value of said bit pattern by said given amount.

7. A modulator as set forth in claim 4 wherein said encoding means includes second comparator means for comparing said binary bit pattern with a reference bit pattern representative of said second preselected binary bit pattern and, when a match is detected, providing a second signal for use in effecting said decrease in the value of said bit pattern by said given amount.

8. A modulator as set forth in claim 4 wherein said encoding means includes first comparator means for comparing said binary bit pattern with a reference bit pattern representative of a first preselected binary bit pattern and, upon detection of a match, providing a first signal for use in effecting said increase in the value of said bit pattern by said given amount, and second comparator means for comparing said binary bit pattern with a reference bit pattern representative of a second preselected binary bit pattern and, upon detection of a match, providing a second signal for use in effecting said decrease in the value of said bit pattern by said given amount.

9. A modulator as set forth in claim 8 wherein said first preselected binary bit pattern is a bit pattern wherein each of the bits exhibits a first binary level and wherein said second preselected bit pattern is a bit pattern wherein each of the bits is of a second binary level.

10. A pulse step modulator comprising:

a plurality of N series connected unit step modules each including a DC voltage source having a value V and an associated actuatable switching means for, when actuated, turning on said associated module to provide a unit step voltage of said value V;

a plurality of M series connected binary step modules connected together in series with said series connected unit step modules with each binary step module including a DC voltage source having a value which is a fraction of V and wherein each said binary step module has an associated actuatable switching means for, when actuated, turning on said associated binary step module to provide a binary step voltage;

an output circuit connected to said series connected modules for providing an output voltage to a load wherein the magnitude of the output voltage is equal to the sum of all of the voltage sources of said modules that are turned on;

means for receiving an analog input signal and converting same into digital words, each said word including first and second multi-bit digital portions;

means for converting said first portion into N unit step control signals for controlling actuation of said N unit step modules so that the number of said unit step modules that are turned on is dependent upon the magnitude of said analog input signal;

said second multi-bit digital portion including a binary bit pattern that varies with increasing and decreasing values of said input analog signal; and encoding means having means responsive, while said binary bit pattern is varying in value, to a preselected binary bit pattern for changing the value thereof by a given amount.

11. A pulse step modulator as set forth in claim 10 wherein said encoding means includes a first means responsive, while said binary bit pattern is increasing in value, to a first preselected binary bit pattern for increasing the value thereof by said given amount.

12. A pulse step modulator as set forth in claim 10 wherein said encoding means has means responsive, while said binary bit pattern is decreasing in value, to a second preselected binary bit pattern for decreasing the value thereof by a given amount.

13. A pulse step modulator as set forth in claim 10 wherein said encoding means has first means responsive, while said bit pattern is increasing in value, to a first preselected binary bit pattern for increasing the value thereof by a given amount and second means responsive, while said bit pattern is decreasing in value, to a second preselected binary bit pattern for decreasing the value thereof by a given amount.

14. A pulse step modulator as set forth in claim 13 wherein said first preselected binary bit pattern is a bit pattern wherein each of the bits exhibits a first binary level and wherein said second preselected bit pattern is a bit pattern wherein each of the bits is of a second binary level.

15. A pulse step modulator as set forth in claim 13 wherein said encoding means includes first means for comparing said binary bit pattern with a reference bit pattern representative of said first preselected binary bit pattern and, upon detection of a match, providing a first signal for use in effecting said increase in the value of said bit pattern by said given amount.

16. A pulse step modulator as set forth in claim 13 wherein said encoding means includes second comparator means for comparing said binary bit pattern with a reference bit pattern representative of said second preselected binary bit pattern and, when a match is detected, providing a second signal for use in effecting said decrease in the value of said bit pattern by said given amount.

17. A pulse step modulator as set forth in claim 13 wherein said encoding means includes first comparator means for comparing said binary bit pattern with a reference bit pattern representative of a first preselected binary bit pattern and, upon detection of a match, providing a first signal for use in effecting said increase in the value of said bit pattern by said given amount, and second comparator means for comparing said binary bit pattern with a reference bit pattern representative of a second preselected binary bit pattern and, upon detection of a match, providing a second signal for use in effecting said decrease in the value of said bit pattern by said given amount.

18. A pulse step modulator as set forth in claim 17 wherein said first preselected binary bit pattern is a bit pattern wherein each of the bits exhibits a first binary level and wherein said second preselected bit pattern is a bit pattern wherein each of the bits is of a second binary level.

* * * * *